United States Patent
Patterson et al.

(10) Patent No.: US 9,519,210 B2
(45) Date of Patent: Dec. 13, 2016

(54) VOLTAGE CONTRAST CHARACTERIZATION STRUCTURES AND METHODS FOR WITHIN CHIP PROCESS VARIATION CHARACTERIZATION

(71) Applicant: INTERNATIONAL BUSINESS MACHINES CORPORATION, Armonk, NY (US)

(72) Inventors: Oliver D. Patterson, Poughkeepsie, NY (US); Yunsheng Song, Poughkeepsie, NY (US); Zhigang Song, Hopewell Junction, NY (US); Yongchun Xin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 14/549,719

(22) Filed: Nov. 21, 2014

(65) Prior Publication Data
US 2016/0148849 A1 May 26, 2016

(51) Int. Cl.
| | |
|---|---|
| *G06F 17/50* | (2006.01) |
| *G03F 1/36* | (2012.01) |
| *H01L 23/522* | (2006.01) |
| *H01L 21/66* | (2006.01) |

(52) U.S. Cl.
CPC .............. *G03F 1/36* (2013.01); *G06F 17/5072* (2013.01); *G06F 17/5081* (2013.01); *H01L 22/30* (2013.01); *H01L 23/5226* (2013.01); *H01L 2924/0002* (2013.01)

(58) Field of Classification Search
CPC .... H01L 22/14; H01L 21/30625; H01L 25/50; H01L 23/5226; H01L 23/528; G03F 1/36; G06F 17/5072; G06F 17/5081
See application file for complete search history.

(56) References Cited

U.S. PATENT DOCUMENTS

| | | |
|---|---|---|
| 5,962,867 A | 10/1999 | Liu |
| 6,936,920 B2 | 8/2005 | Whitefield |
| 7,179,661 B1 | 2/2007 | Satya et al. |

(Continued)

OTHER PUBLICATIONS

Boye et al., "E-beam inspection for combination use of defect detection and CD measurement". 23rd Annual SEMI Advanced Semiconductor Manufacturing Conference (ASMC), May 15-17, 2012, pp. 371-374.

(Continued)

*Primary Examiner* — Vuthe Siek
(74) *Attorney, Agent, or Firm* — Schmeiser, Olsen & Watts; Steven Meyers

(57) ABSTRACT

A method for designing, a structure, method of inspecting and a computer system for designing voltage contrast integrated circuit characterization. The design method includes selecting a design level of a mask design shapes file; selecting a region of the design level having an open region having no design shapes and an adjacent circuit region having circuit design shapes; selecting a sub-region of the circuit region adjacent to the open region; copying design shapes of the sub-region to generate a characterization cell identical to the sub-region; modifying the characterization cell to generate a passive voltage contrast characterization cell; and placing the passive voltage contrast characterization cell into the open region adjacent to the sub-region to generate a modified design level.

25 Claims, 15 Drawing Sheets

(56) References Cited

U.S. PATENT DOCUMENTS

| | | | |
|---|---|---|---|
| 7,393,755 B2 | 7/2008 | Smith et al. | |
| 7,679,083 B2 | 3/2010 | Sun et al. | |
| 7,902,548 B2 | 3/2011 | Lim et al. | |
| 2003/0044696 A1* | 3/2003 | Liu | G03F 1/144 430/5 |
| 2005/0147287 A1* | 7/2005 | Sakai | G01N 21/9501 382/141 |
| 2006/0225023 A1* | 10/2006 | Adkisson | H01L 22/20 716/55 |
| 2007/0210453 A1 | 9/2007 | Large et al. | |
| 2009/0130783 A1* | 5/2009 | Miyashita | H04R 19/005 438/10 |
| 2009/0240364 A1* | 9/2009 | Lucas | G03F 1/144 700/105 |

OTHER PUBLICATIONS

Chen et al., "E-beam inspection for gap physical defect detection in 28nm CMOS process". 24th Annual SEMI Advanced Semiconductor Manufacturing Conference (ASMC), May 14-16, 2013, pp. 307-309.

Solecky et al., "In-line E-beamWafer Metrology and Defect Inspection: The End of an Era for Image-based Critical Dimensional Metrology? New life for Defect Inspection." In SPIE Advanced Lithography Symposium vol. 8681, Apr. 10, 2013, pp. 86810D-1 to 86810D-19.

Patterson et al., "Detection of Sub-Design Rule Physical Defects Using E-Beam Inspection", IEEE Transactions on Semiconductor Manufacturing, vol. 26, No. 4, Sep. 24, 2013, pp. 476-481.

Patterson et al., "Early Detection of Systematic Patterning Problems for a 22nm SOI Technology using E-Beam Hot Spot Inspection", 24th Annual SEMI Advanced Semiconductor Manufacturing Conference (ASMC), May 14-16, 2013, pp. 295-300.

Chen et al "Mechanism and Application of NMOS Leakage with Intra-Well Isolation Breakdown by Voltage Contrast Detection", Journal of Semiconductor Technology and Science, 13(4), Jan. 2013, 402-409.

* cited by examiner

*FIG. 9*

*FIG. 10* ized in the kerf area (non-functional perimeter regions) of the chip in order to represent all regions of the chip. However, as the size of integrated circuit chips increase, characterization structures in the kerf do not represent variation within the chip which are becoming more pronounced as the chip size increases.

Accordingly, there exists a need in the art to mitigate the deficiencies and limitations described hereinabove.

VOLTAGE CONTRAST CHARACTERIZATION STRUCTURES AND METHODS FOR WITHIN CHIP PROCESS VARIATION CHARACTERIZATION

BACKGROUND

The present invention relates to the field of integrated circuit design and fabrication; more specifically, it relates to voltage contrast characterization structures and methods for within chip process variation characterization as well as a computer based design system for generating voltage contrast characterization structures.

The current demand for high performance microelectronics requires more and more functions to be integrated into one chip which drives increased chip size. Current characterization structures are placed in the kerf area (non-functional perimeter regions) of the chip in order to represent all regions of the chip. However, as the size of integrated circuit chips increase, characterization structures in the kerf do not represent variation within the chip which are becoming more pronounced as the chip size increases.

Accordingly, there exists a need in the art to mitigate the deficiencies and limitations described hereinabove.

BRIEF SUMMARY

A first aspect of the present invention is a method, comprising: selecting a design level of a mask design shapes file; selecting a region of the design level having an open region having no design shapes and an adjacent circuit region having circuit design shapes; selecting a sub-region of the circuit region adjacent to the open region; copying design shapes of the sub-region to generate a characterization cell identical to the sub-region; modifying the characterization cell to generate a passive voltage contrast characterization cell; and placing the passive voltage contrast characterization cell into the open region adjacent to the sub-region to generate a modified design level.

A second aspect of the present invention is an integrated circuit chip, comprising: a first region having circuit features; a second region having a passive voltage contrast characterization cell, the passive voltage contrast having first features duplicating the size and relative positions of circuit features of a sub-region of the first region and having second features interconnected to form a ground feature; a third region having fill shapes; the fill shapes not connected to each other or to any shape of the first or second regions; and wherein the first and second features of the second region are not connected to the circuit features of the first region or to the fill shapes of the third region.

A third aspect of the present invention is a method comprising: providing an integrated circuit chip comprising: a first region having circuit features; a second region having a passive voltage contrast characterization cell, the passive voltage contrast having first features duplicating the size and relative positions of circuit features of a sub-region of the first region and having second features interconnected to form a ground feature; a third region having fill shapes; the fill shapes not connected to each other or to any shape of the first or second regions; and wherein the first and second features of the second region are not connected to the circuit features of the first region or to the fill shapes of the third region; placing the integrated circuit chip in a scanning electron microscope; and using the SEM, performing an inspection of the passive voltage contrast characterization cell under voltage contrast conditions.

A fourth aspect of the present invention is a computer system comprising a processor, a memory coupled to the processor, and a computer readable storage device coupled to the processor, the storage device containing program code configured to be executed by the processor via the memory to implement a method for designing a voltage contrast characterization cell, the method comprising: selecting a design level of a mask design shapes file; selecting a region of the design level having an open region having no design shapes and an adjacent circuit region having circuit design shapes; selecting a sub-region of the circuit region adjacent to the open region; copying design shapes of the sub-region to generate a characterization cell identical to the sub-region; modifying the characterization cell to generate a passive voltage contrast characterization cell; and placing the passive voltage contrast characterization cell into the open region adjacent to the sub-region to generate a modified design level.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 9 and 10 illustrate exemplary arrangements of voltage contrast characterization cells according to embodiments of the present invention;

DETAILED DESCRIPTION

Figure 1:
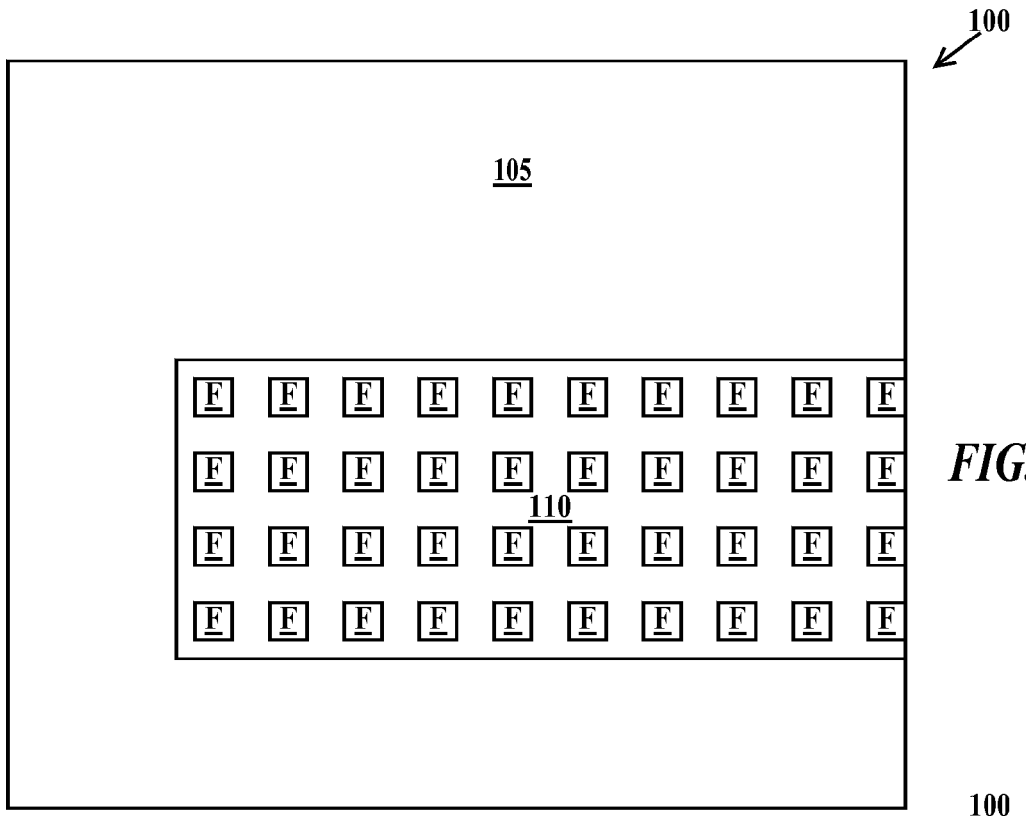
FIG. 1 is a top view of a region of a level of an integrated circuit without modification according to an embodiment of the present invention.

Passive voltage contrast imaging using a scanning electron microscope (SEM) is based on the fact that the image displayed on the SEM screen is formed by scanning an electron beam on a surface and collecting the secondary and back-scattered electrons to form the image. Under voltage contrast conditions, structures that are isolated from ground can be charged creating an electrical field which alters the emission of secondary electrons which manifests as a brightness difference on the SEM screen. An SEM can run in either positive mode voltage contrast or negative mode voltage contrast. In positive mode voltage contrast features that are grounded are brighter than features that are not grounded. Voltage contrast characterization cells according to embodiments of the present invention are passive in that no external voltage differentials are applied to them and they do not have pads for voltage supply probes and they cannot be probed. Unless otherwise noted, positive mode voltage contrast is assumed. In one example, ground is the semiconductor substrate the chip comprises. In one example, long metal lines can serve as a virtual ground because they have more capacitance than shorter metal lines.

Fabrication of integrated circuit chips often requires one or more chemical-mechanical-polish (CMP) processes. A CMP process subjects a surface of a wafer on which multiple integrated circuit chips are being fabricated to a combination of mechanical abrasion and chemical dissolution to remove materials from the surface of the wafer and generate a planer surface.

An example of a fabrication step that uses CMP is the formation of metal (e.g., copper) damascene wires. A damascene process is one in which trenches or openings are formed in a dielectric layer, an electrical conductor of sufficient thickness to fill the trenches is formed in the trenches and on a top surface of the dielectric. A CMP process is performed to remove excess conductor from the surface of the dielectric layer and make the surface of the conductor co-planar with the top surface of the dielectric layer to form damascene wires (or damascene vias). The uniformity of the planarization depends on the pattern density of conductor being uniform in any given region of the chip. To ensure such uniformity design fill shapes are added to the shapes files used to produce photomasks for levels that require CMP in their fabrication. The voltage contrast characterization cells of the embodiments of the present invention are particularly suited for characterizing interconnect structures after CMP processing.

Circuit design shapes and design fill shapes exist in shapes files of device and wiring levels of a circuit design and become photomask shapes on photomasks generated from the circuit design. Design fill shapes result in fill shapes on actual integrated circuits. Fill shapes are generally not electrically connected to each other or any wire or via contained in the same wiring level as the fill shapes or to any other wire or via in other wiring levels.

The present invention places SEM passive voltage contrast characterization cells that either mimic local circuit features (modified for voltage contrast) or are specifically designed for voltage contrast into areas of the integrated circuit chip that would otherwise be occupied by fill shapes for the purpose of CMP pattern density uniformity. These voltage contrast characterization cells are not functional circuits of the integrated circuit chip and are not connected to functional circuits of the integrated circuit with the possible exception of connections to ground in certain cases. Voltage contrast characterization cells according to embodiments of the present invention characterize adjacent circuits for susceptibility to process defects or characterize adjacent circuits for defect sensitivity to process variations such as line-widths, wire spacings and via cross-sectional area. Vias are structures that connect wires in different levels together.

Performing an electron-beam (E-beam) voltage contrast inspection under passive voltage contrast conditions of the aforesaid voltage contrast characterization structures distributed in different regions across an integrated circuit chip provides characterization of across-chip process variations. In one example, the inspection is performed on integrated circuit chips that are partially fabricated on semiconductor wafers containing a multiplicity of individual integrated circuit chips. In one example, the inspection is performed on integrated circuit chips that are partially fabricated on semiconductor wafers containing a multiplicity of individual integrated circuit chips after a CMP process step.

FIG. 1 is a top view of a region of a level of an integrated circuit without modification according to an embodiment of the present invention. In FIG. 1, a region 100 of an integrated circuit chip comprises a functional circuit region 105 having circuit structures and a fill region 110. Fill region 110 includes an array of fill shapes "F." The fill shapes "F" provide uniform pattern density for CMP processing. In an initial design there are circuit regions and open regions. Circuit regions contain circuit design shapes and open regions contain no shapes of any type, hence the name open region. Open regions have dimensions at least 10 times larger than the minimum linewidth or spacing of the circuit features of any given layer. Design fill shapes are added to open regions of the design as the design process progresses.

Figure 2:
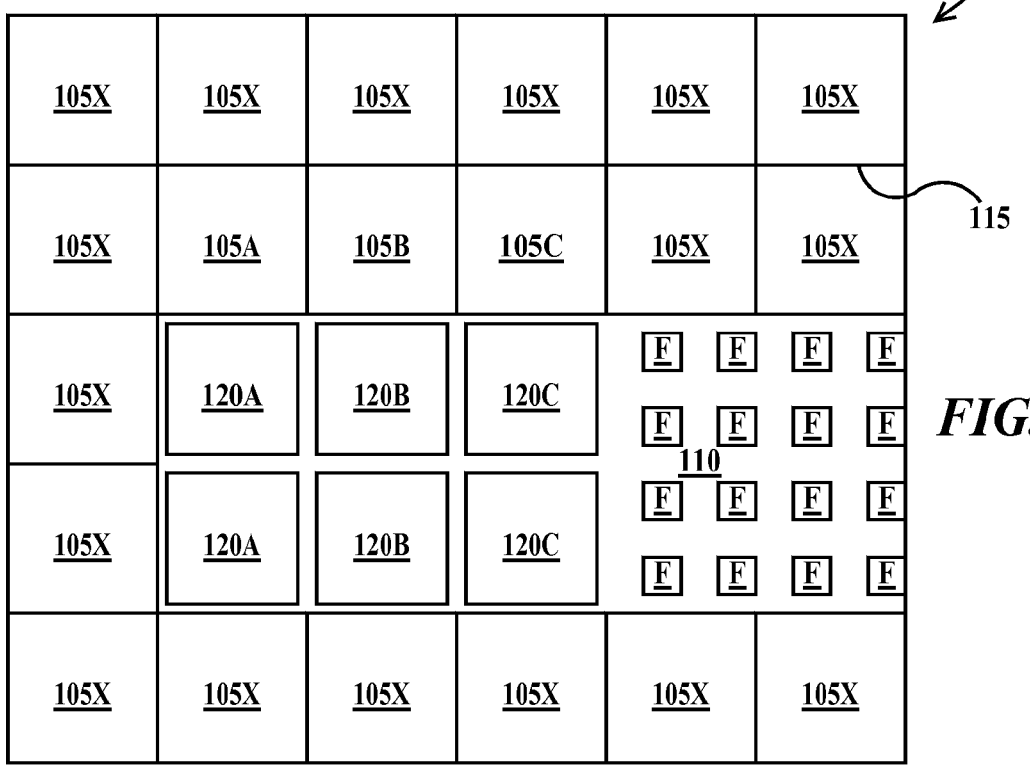
FIG. 2 is a top view of the same region of a level of an integrated circuit as illustrated in FIG. 1 with modification according to an embodiment of the present invention.

FIG. 2 is a top view of the same region of a level of an integrated circuit as illustrated in FIG. 1 with modification according to an embodiment of the present invention. In FIG. 2, functional circuit region 105 (see FIG. 1) has been sub-divided into sub-regions 105A, 105B, 105C and 105X by a virtual grid 115. Sub-regions 105X are not necessarily the same and contain various circuit structures. Sub-regions 105A, 105B and 105C may be the same or different, but contain circuit structures that are copied, cropped and then modified to form voltage contrast characterization cells 120A, 120B and 120C which are placed in fill region 110. Dummy fill shapes "F" fill space in fill region 110 not occupied by voltage contrast characterization cells 120A, 120B and 120C. It should be noted that sub-regions 105A, 105B and 105C are located immediately adjacent to fill region 110. Thus voltage contrast characterization cells 120A, 120B and 120C mimic the actual circuit structures of sub-regions 105A, 105B and 105C. The number of "mimic" voltage contrast characterization cells may be more or less than the three illustrated in FIG. 2 and may be arranged in a different pattern in the open region. However, it is preferred that at least one "mimic" voltage contrast characterization cell be of each sub-region copied be placed adjacent to the sub-region it "mimics."

Figure 3A:
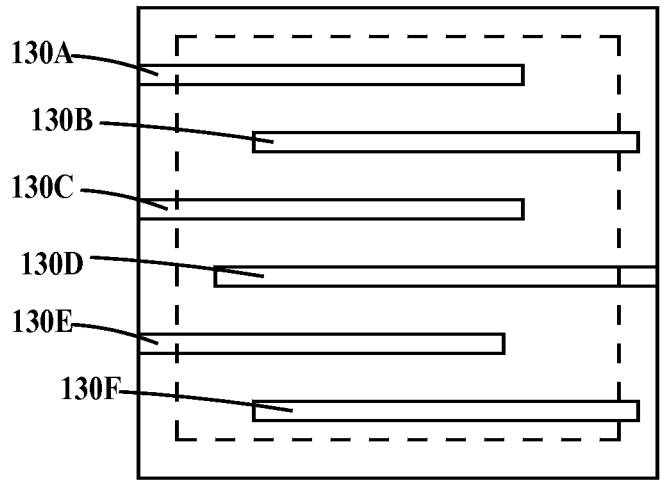
FIGS. 3A through 3C are top views illustrating a method for generating voltage contrast structures according to an embodiment of the present invention.
Figure 3B:
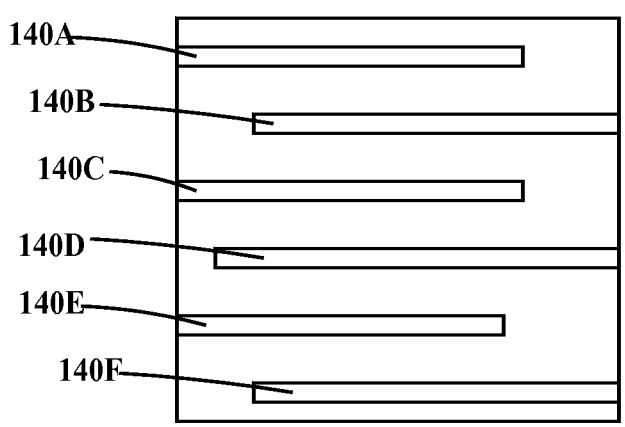
Figure 3C:
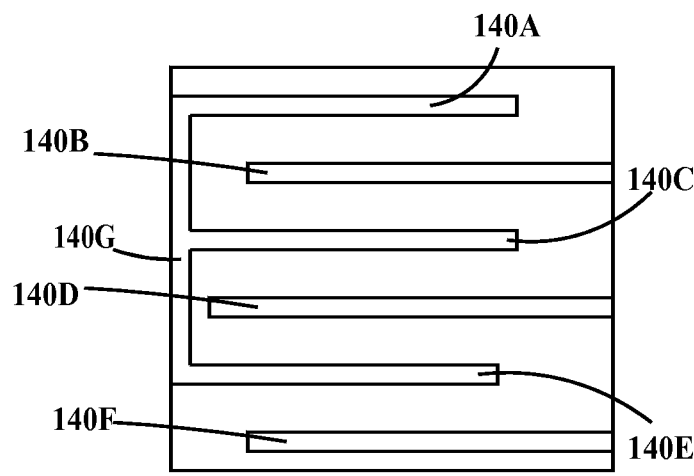

FIGS. 3A through 3C are top views illustrating a method for generating voltage contrast structures according to an embodiment of the present invention. In FIGS. 3A through 3C, the structures shown represent shapes in a physical layout file called a shapes file. In one example, shapes files are generated, usually from a netlist which are schematic representations of the circuits of an integrated circuit. In one example, shapes files are generated by an operator using a computer based design system. A shapes file is a representation of the geometric shapes required to fabricate a photomask which is then used in the fabrication of a level of an integrated circuit.

In FIG. 3A a sub-region 125 of an integrated circuit includes wire shapes 130A, 130B, 130C, 130D, 130E and 130F. In FIG. 3B, a cropped cell 135 is generated by "cropping" the perimeter of sub-region 125 at the dashed lines of FIG. 3A Wire shapes 130A, 130B, 130C, 130D, 130E and 130F of FIG. 3A become wire shapes 140A, 140B, 140C, 140D, 140E and 140F in FIG. 3B. In FIG. 3C wire shapes 140A, 140C and 140E are connected together by wire shape 140G to form a voltage contrast characterization cell 145. Wire shape 140G serves as the virtual ground for voltage contrast characterization cell 145. Thus voltage contrast characterization cell 145 will be a good shorts monitor for sub-region 125 when the integrated circuit is fabricated, particularly when the same optical-proximity correction (OPC) rules are applied to the shapes of voltage contrast characterization cell 145 and sub-region 125. See FIGS. 11 and 17 and discussion infra. The structure of wire shapes 140A, 140C, 140E and 140G forms a virtual ground for voltage contrast. When a chip is fabricated and voltage contrast analysis performed, any wire based on wire shapes 140B, 140D or 140F not shorted to virtual ground based on wire shape 140G will appear darker than the other wires. Because of the cropping between FIGS. 3A and 3B, voltage contrast characterization cell 145 of FIG. 3C is smaller in both the X and Y dimensions. It is advantageous that sub-region 125 be small (e.g. between 1 um×1 um and 0.5 um and 0.5 um, but could be larger) with voltage contrast characterization cell being about 0.1 um smaller in each dimension (e.g. between 0.9 um×0.9 um and 0.4 um and 0.4 um or larger). Small voltage contrast characterization cell size allows more efficient filling of the open regions and is possible because probing is not required for the use of these cells.

Figure 4:
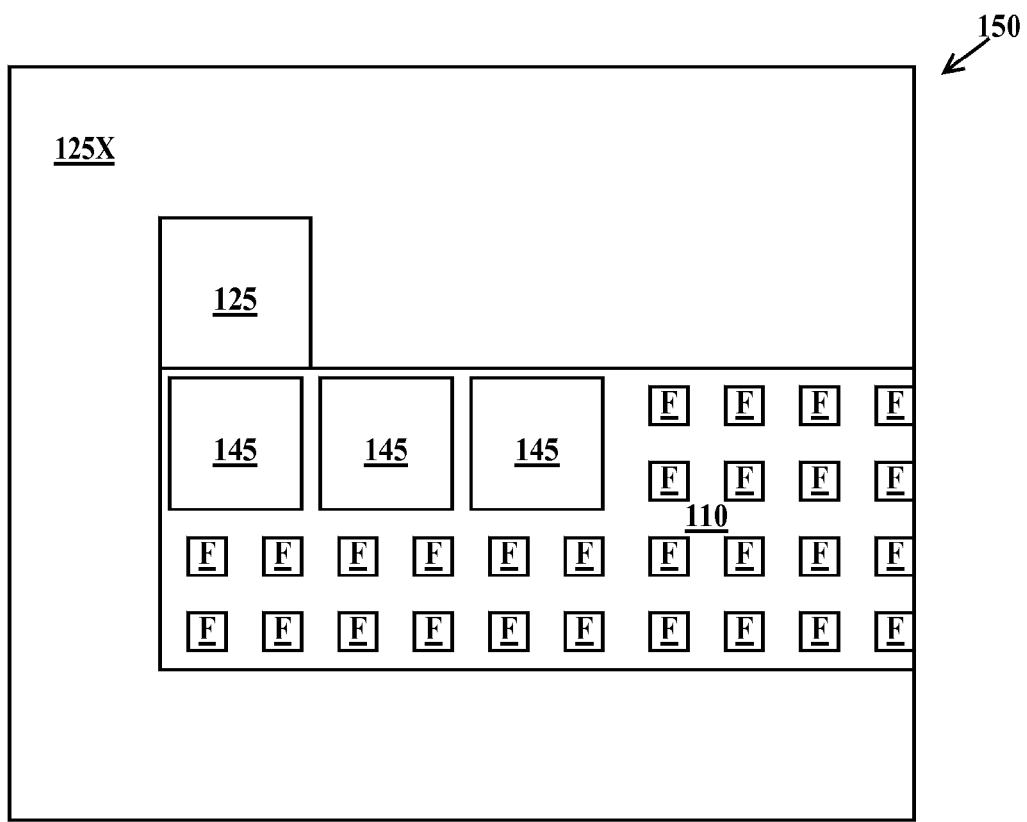
FIG. 4 is a top view of a region of a level of an integrated circuit illustrating placement of the voltage contrast structure of FIG. 3C into a region of an integrated circuit according to an embodiment of the present invention.

FIG. 4 is a top view of a region of a level of an integrated circuit illustrating placement of the voltage contrast structure of FIG. 3C into a region of an integrated circuit according to an embodiment of the present invention. In FIG. 4 a region 150 of a physical integrated circuit is illustrated. Region 150 includes a functional circuit region 125X and a sub-region 125 illustrated in FIG. 3A. Fill region 110 includes voltage contrast characterization cells 145 and dummy fill shapes "F." The voltage contrast characterization cells 145 do not physically contact each other or functional circuit region 125X or sub-region 125 or dummy fill shapes "F." The voltage contrast characterization cells 145 do not electrically contact each other or functional circuit region 125X or sub-region 125 other than optionally through ground, or electrically contact dummy fill shapes "F."

Figure 5A:
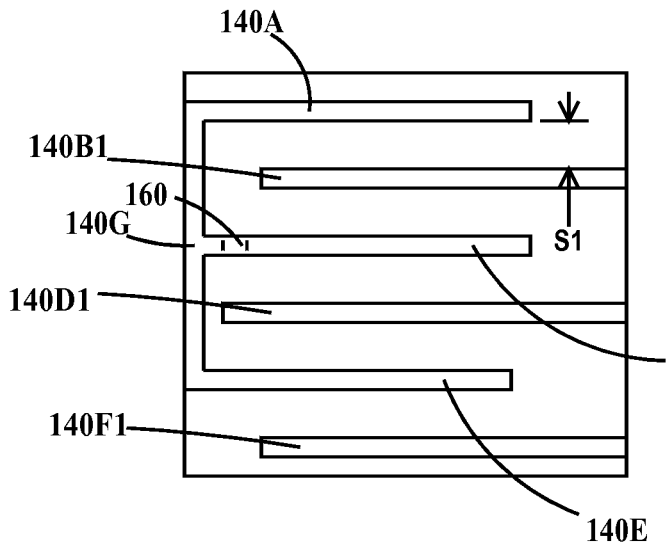
FIGS. 5A through 5C are top views illustrating a method for generating first exemplary voltage contrast characterization structures according to an embodiment of the present invention from the structure of FIG. 3C.
Figure 5B:
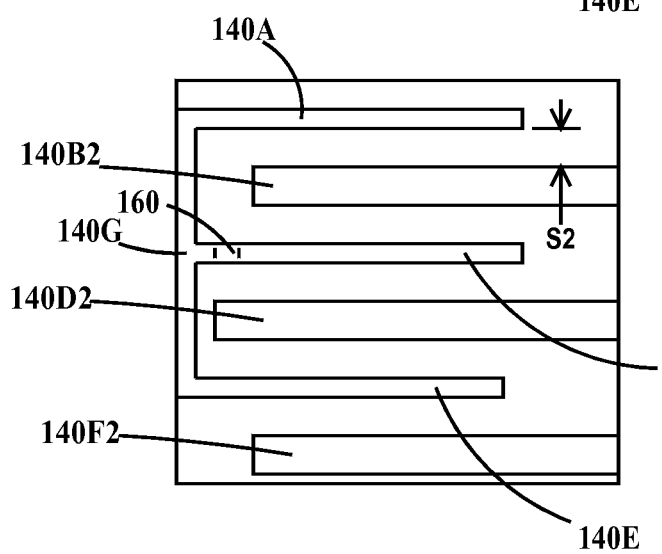
Figure 5C:
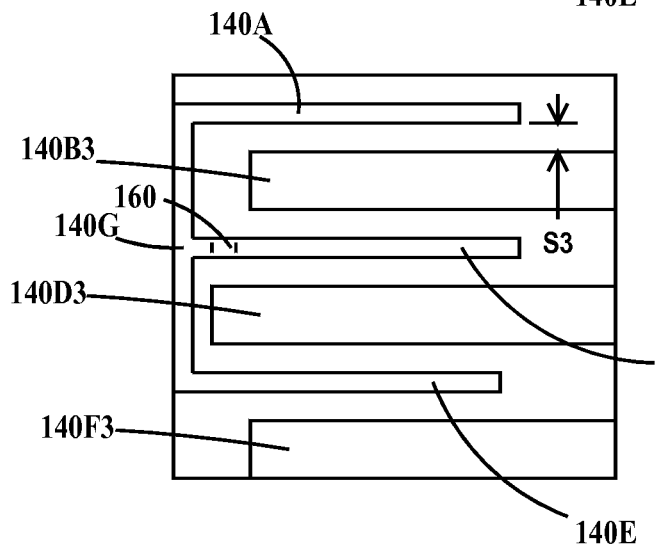

FIGS. 5A through 5C are top views illustrating a method for generating first exemplary voltage contrast characterization structures according to an embodiment of the present invention from the structure of FIG. 3C. While the voltage contrast characterization cell 145 of FIG. 3C will act as a defect monitor because it duplicates the linewidth, spacing and layout of the sub-region of the integrated circuit that it "mimics", the voltage contrast characterization cell 145 of FIG. 3C can be modified to act as a process window monitor. In FIG. 5A, voltage contrast characterization cell 155A is the same as voltage contrast characterization cell 145 of FIG. 3C except an optional ground connection 160 (physical or virtual) is illustrated and the linewidth spacing is indicated and wires 140B, 140D and 140E are renamed 140B1, 140D1 and 140F1 respectively. In FIG. 5A this space is S1.

In order to get a good voltage contrast signal (one with high contrast between grounded and non-grounded structures) on the SEM monitor, one node of the voltage contrast structure should be connected to ground. A silicon-on-insulator (SOI) substrate comprises a silicon layer separated from a supporting substrate by an insulating layer. For an SOI substrate an isolated and electrically conductive path to ground can be formed from a node of the voltage contrast structure through the underlying layers and through an opening in the SOI insulator layer into the supporting substrate. For bulk silicon substrates an isolated and electrically conductive path to ground can be formed extending from a node of the voltage contrast structure through the underlying layers to a substrate contact.

When a physical ground path cannot be incorporated or it is not desirable to include a ground path in the voltage characterization cell, a virtual ground may be used. A virtual ground is where a first node with a larger area than the second node is used to supply electrons instead of the substrate. In one example, the area of the first (virtual ground) node is between two and four times the area of the second node. The virtual ground node will not charge up as much as the second node and appear brighter than the second node under voltage contrast conditions. If there is a short between the first and second nodes, shorted second nodes will be brighter than non-shorted second nodes. In FIG. 5A, the structure of wire shapes 140A, 140C, 140E and 140G form a virtual ground (when ground 160 is not present).

FIG. 5B is similar to FIG. 5A except in voltage characterization cell 155B, except that the spacing between the ground structure (140A, 140C, 140E and 140G) and wires 140B2, 140D2 and 140F2) is decreased to S2 because wires 140B2, 140D2 and 140F2 are wider than wires 140B1, 140D1 and 140F1 of FIG. 5A.

FIG. 5C is similar to FIG. 5B except in voltage characterization cell 155C, except that the spacing between the ground structure (140A, 140C, 140E and 140G) and wires 140B3, 140D3 and 140F3) is decreased to S23 because wires 140B3, 140D3 and 140F3 are wider than wires 140B2, 140D2 and 140F2 of FIG. 5B. Thus the combination of voltage characterization cells 155A, 155B and 155C provide a process monitor that characterizes the susceptibility of the process to shorts to the process variations in linewidth (or line to line spacing).

Figure 6:
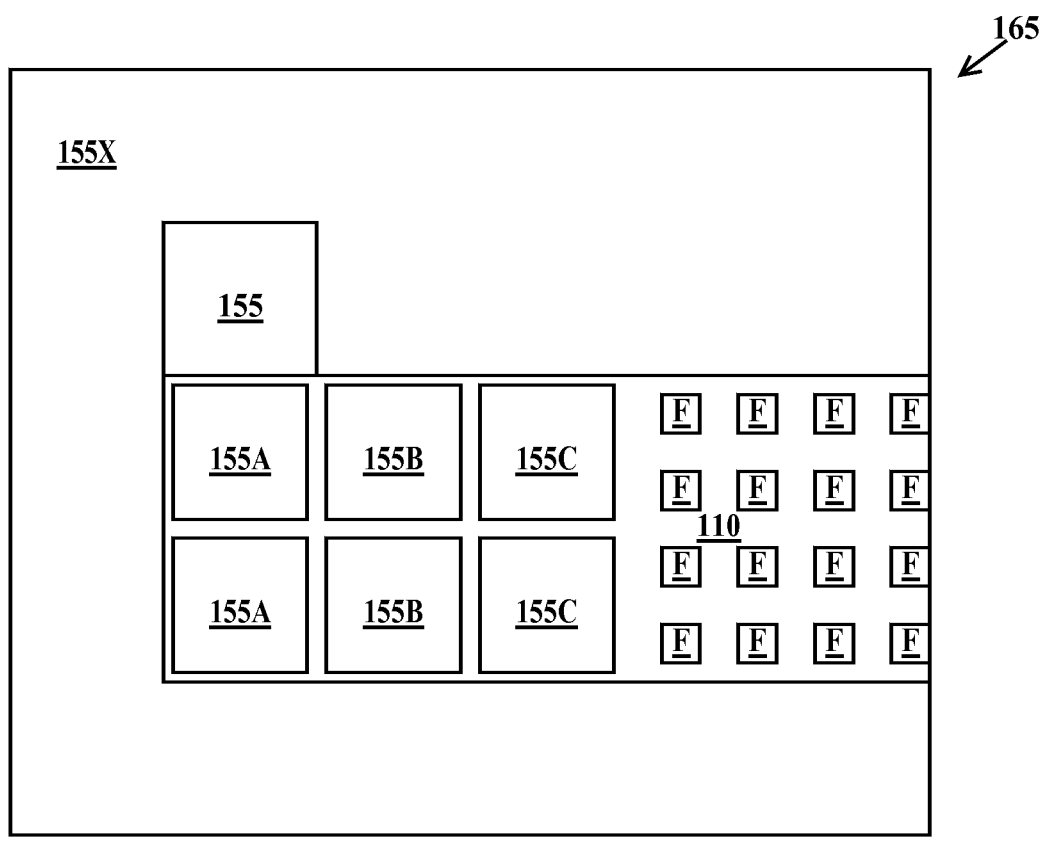
FIG. 6 is a top view of a region of a level of an integrated circuit illustrating placement of the voltage contrast characterization structures of FIGS. 5A, 5B and 5C into a region of an integrated circuit according to an embodiment of the present invention.

FIG. 6 is a top view of a region of a level of an integrated circuit illustrating placement of the voltage contrast characterization structures of FIGS. 5A, 5B and 5C into a region of an integrated circuit according to an embodiment of the present invention. In FIG. 6 a region 165 of a physical integrated circuit is illustrated. Region 165 includes a functional circuit region 155X and a sub-region 155. Fill region 110 includes voltage contrast characterization cells 155A, 155B and 155C and dummy fill shapes "F." The voltage contrast characterization cells 155A, 155B and 155C do not physically contact (other than an optional ground contact) each other or functional circuit region 155X or sub-region 155 or dummy fill shapes "F."

Figure 7A:
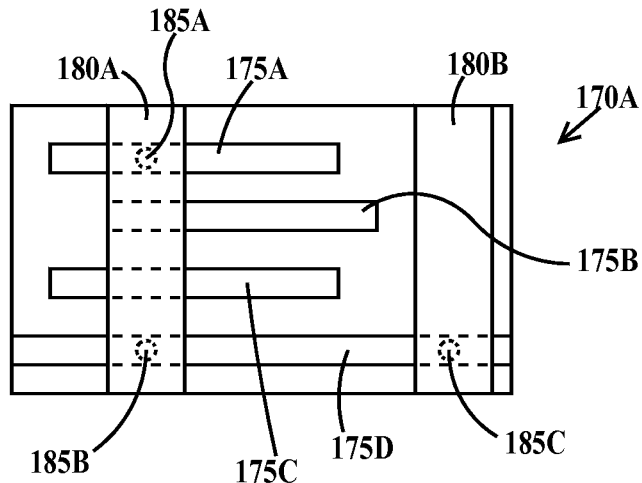
FIGS. 7A through 7C are top views illustrating a method for generating a second exemplary voltage contrast characterization structure according to an embodiment of the present invention.
Figure 7B:
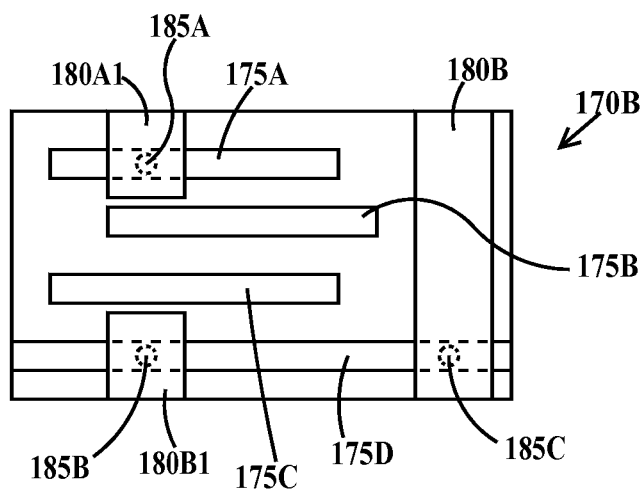
Figure 7C:
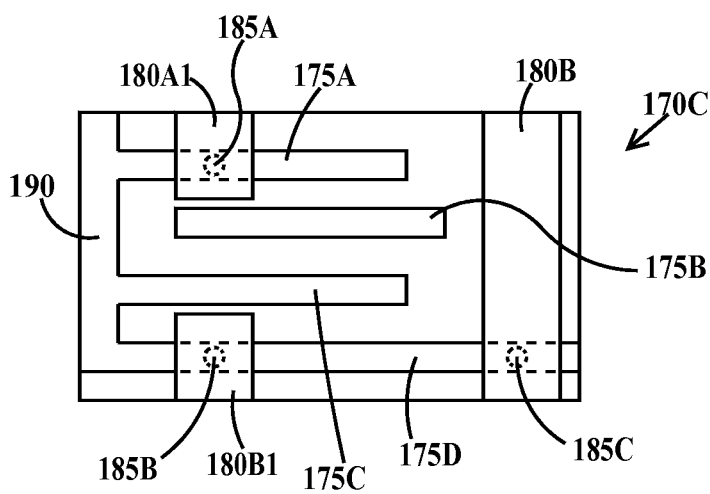

FIGS. 7A through 7C are top views illustrating a method for generating a second exemplary voltage contrast characterization structure according to an embodiment of the present invention. The voltage contrast characterization cells described supra have been single process levels. It is also possible to apply the methodology of the embodiments of the present invention to voltage contrast characterization cells that involve two (or more) process levels. FIGS. 7A, 7B and 7C are top views that superimpose three design (shapes) files (first metal, interconnect via, and second metal). In FIG. 7A, a "mimicked" and cropped design 170A includes first metal wire shapes 175A, 175B, 175C and 175D and second metal wire shapes 180A and 180B. Wire 175A is connected to wire shape 180A by via shape 185A. Wire shape 175D is connected to wire shape 180A by via shape 185B. Wire shape 175D is connected to wire shape 180B by via shape 185C. In FIG. 7B, design 170A of FIG. 7A is modified by breaking wire shape 180A into two pieces (180A1 and 180A1) so wire shape 180A no longer connects via shapes 185A and 185B. In FIG. 7C, design 170B of FIG. 7B is modified by adding wire shape 190 that connects wire shapes 175A, 175C and 175D together. When physically fabricated design 170C will become a voltage contrast characterization cell. An open vias (no connection between first and second metals) will result in the associated second metal line being dark.

Figure 8:
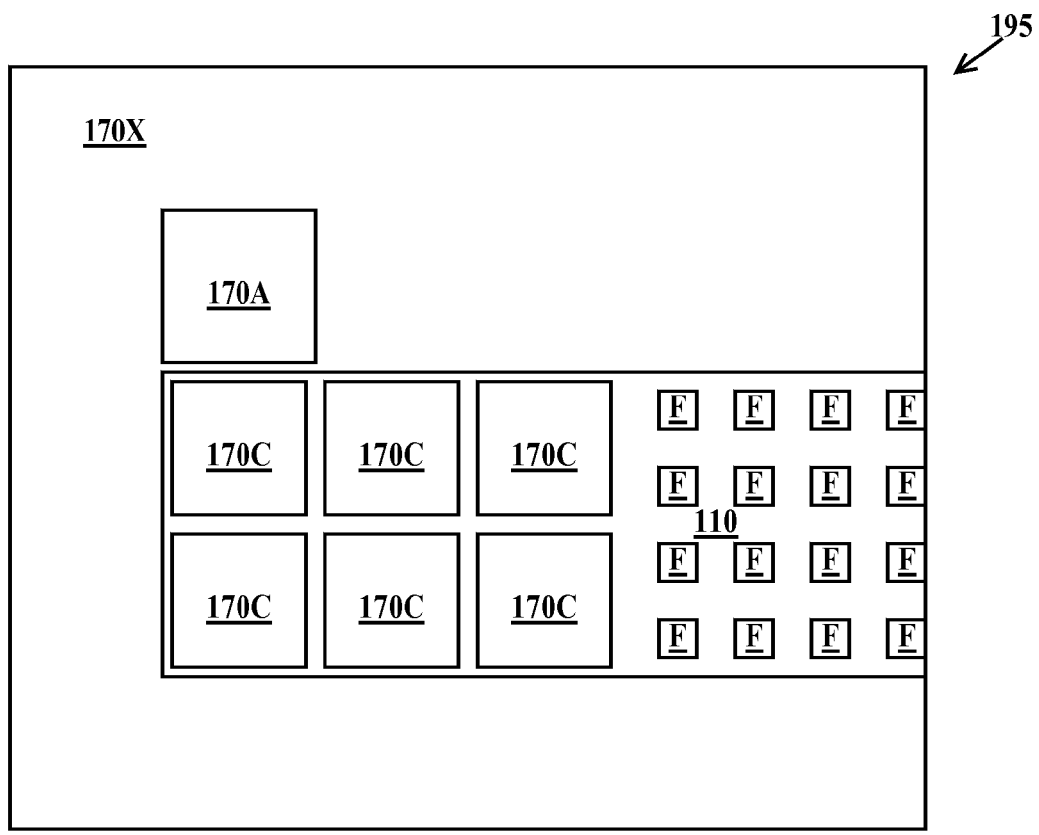
FIG. 8 is a top view of a region of a level of an integrated circuit illustrating physical placement of a voltage contrast characterization structure based on the design of FIG. 7C into a region of an integrated circuit according to an embodiment of the present invention.

FIG. 8 is a top view of a region of a level of an integrated circuit illustrating physical placement of a voltage contrast characterization structure based on the design of FIG. 7A into a region of an integrated circuit according to an embodiment of the present invention. In FIG. 8 a region 195 of a physical integrated circuit is illustrated. Region 195 includes a functional circuit region 170X and a sub-region 170A. Fill region 110 includes voltage contrast characterization cells 170C and dummy fill shapes "F." The voltage contrast characterization cells 170C do not physically contact (other than an optional ground contact) each other or functional circuit region 170X or sub-region 170C or dummy fill shapes "F." Since three levels are illustrated in FIG. 8, the dummy fill will be different for each level, so only one fill level is shown, through all three would be present physically.

Figures 9, 10:
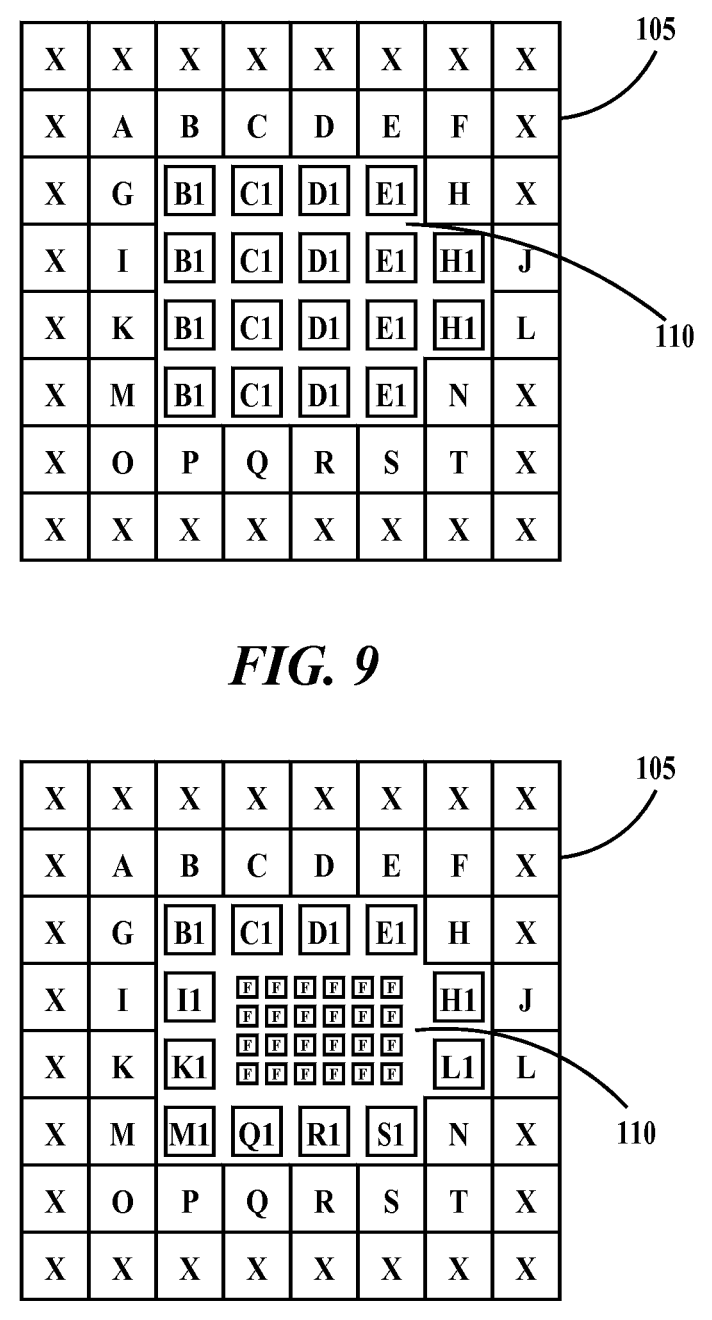

FIGS. 9 and 10 illustrate exemplary arrangements of voltage contrast characterization cells according to embodiments of the present invention. In FIG. 9, functional circuit region 105 has been sub-divided into sub-regions A, B, C, D, E, F, G, H, I, J, K, L, M, N, O, P, Q, R, S, T and X. Sub-regions X are not necessarily the same and contain various circuit structures. Sub-regions A, B, C, D, E, F, G, H, I, J, K, L, M, N, O, P, Q, R, S and T may be the same or different. Sub-regions B, C, D, E and H contain circuit structures that are copied, cropped and then modified to form voltage contrast characterization cells B1, C1, D1, E1 and H1 are placed in fill region 110. Voltage contrast characterization cells B1, C1, D1, E1 and H1 are repeated to fill-up fill region 110.

In FIG. 10, functional circuit region 105 has been sub-divided into sub-regions A, B, C, D, E, F, G, H, I, J, K, L, M, N, O, P, Q, R, S, T and X. Sub-regions X are not necessarily the same and contain various circuit structures. Sub-regions A, B, C, D, E, F, G, H, I, J, K, L, M, N, O, P, Q, R, S and T may be the same or different. Sub-regions B, C, D, E, H, I, K, L, M, Q, R and S contain circuit structures that are copied, cropped and then modified to form voltage contrast characterization cells B1, C1, D1, E1, H1, I1, J1, K1, L1, M1, Q1, R1 and S1 which are placed in the perimeter of fill region 110 adjacent to respective sub-regions B, C, D, E, H, I, K, L, M, Q, R and S. Voltage contrast characterization cells B1, C1, D1 and E1 are repeated to fill-up fill region 110. Dummy fill shapes "F" fill space in fill region 110 not occupied by voltage contrast characterization cells B1, C1, D1, E1, H1, I1, J1, K1, L1, M1, Q1, R1 and S1.

Figure 11:
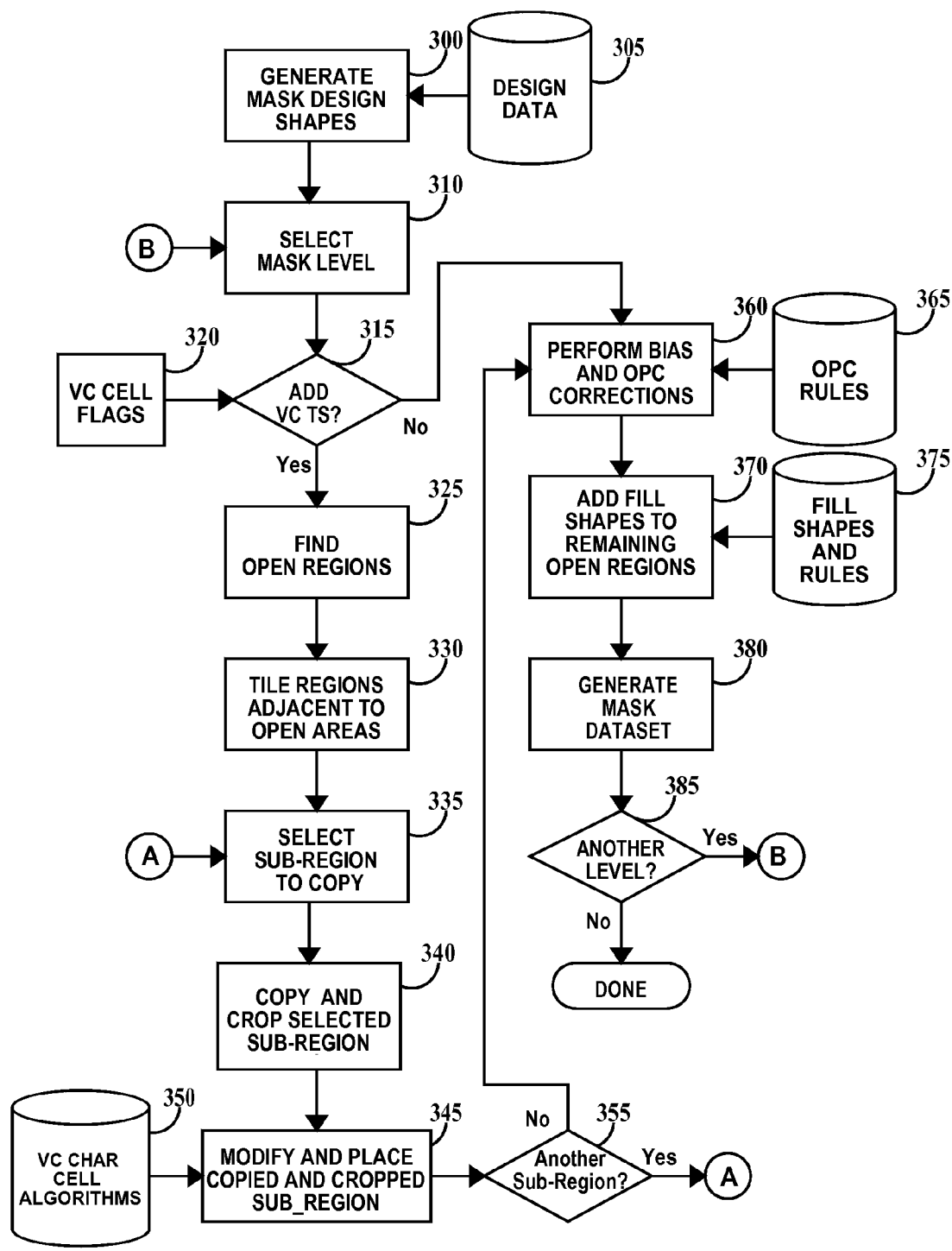
FIG. 11 is a flowchart of a method of adding voltage contrast characterization structures that mimic local circuit structures into an integrated circuit design according to an embodiment of the present invention.

FIG. 11 is a flowchart of a method of adding voltage contrast characterization structures that mimic local circuit structures into an integrated circuit design according to an embodiment of the present invention. In step 300, shape files for each masking level of an integrated circuit are generated from design data file 305. In one example, chip design data file is a netlist which is a schematic representation of the circuits of an integrated circuit. A shapes file is a representation of the geometric shapes required to generate mask datasets which in turn are used to fabricate a photomask for each level of an integrated circuit. In step 310, a mask level is selected. In step 315, it is decided if voltage contrast characterization cells are to be added to the shapes file based on information in voltage contrast cell flags file 320. If one or more of voltage contrast characterization cells are to be added, the method proceeds to step 325, otherwise the method proceeds to step 360.

In step 325, open regions of the design are found. In step 330, circuit regions of the design adjacent to the open regions are virtually sub divided into sub-regions. In step 335, a sub-region to copy is selected. Selection may be based on flags in voltage contrast cell flags file 320 indicating the type (e.g., wire open, wire short, via open), levels (e.g., gate level, wiring level, via interconnect level) and whether the voltage contrast characterization cell is to be simply a process defect monitor (as in FIG. 3C) or a monitor that characterizes the susceptibility of the process to shorts to the process variations (as in the combination of FIGS. 5A, 5B and 5C). In step 340, the selected sub-region is copied and cropped. In step 345, the copied sub-region is modified and placed in the open region based information in voltage contrast test structure algorithms file 350. The algorithms provide information on how to modify the copied functional circuit into a voltage contrast characterization cell and how to further modify the resultant voltage contrast characterization cell into multiple different voltage contrast characterization cell if process variation is to be monitored and how many and where in the open regions voltage contrast characterization cell are to be placed. Next, in step 355 it is determined if another sub-region is to be copied, if yes the method proceeds to step 335 otherwise the method proceeds to step 360. Thus steps 315, 325, 330, 335, 340 and 345 may be repeated multiple times to generate and place different voltage contrast characterization cells based on different sub-regions. If the voltage characterization cell is a multiple level cell, then in step 345, flags are set in voltage contrast cell flags file 320 and voltage contrast characterization cell algorithms file 350 so voltage contrast characterization cells for each of the multiple levels are generated. Voltage contrast characterization cell algorithms file 350 contains rules and algorithms for modifying the selected sub-regions. The method then proceeds to step 360.

In step 360, optical proximity correction based on OPC rules file 365, is performed. The OPC is performed on both the functional circuit shapes of the level and also the voltage contrast characterization cells. Thus the voltage contrast characterization cells are fabricated with the same linewidth, spacings and image rounding as the functional circuit sub-regions that the voltage contrast characterization were based on. OPC changes "corrects" geometric shapes so the shapes prints in the photolithographic process as intended. For example, corners of rectangular shapes often round off, so OPC adds small square shapes to the corner of the shapes. The resultant shape resembles a "dog bone." Before or after bias corrections may also be applied to each shape to compensate for uniform shrinking or swelling of the image during the photolithographic process. Next, in step 370, fill shapes are added to any portion of open regions of the entire design level not already occupied by voltage contrast characterization cells based on fill shapes and rules file 375. Examples of fill shape rules include, but are not limited to: the geometry and dimensions of the fill shapes and open regions, the minimum and maximum distances fill shapes can be placed from function circuit shapes, the distances between fill shapes and the template array pattern used to place the fill shapes. OPC is not performed on fill shapes. In step 380, additional processing of the shapes file is performed to generate a mask dataset, (for example a GL1 (graphics language 1) deck) to drive mask fabrication equipment or to drive direct write equipment. In step 385, it is determined if another design level is to be processed. If another design level is to be processed the method loops back to step 310, otherwise the method terminates.

After mask data sets are generated, they are used to fabricate photomasks. The photomasks are then used to generate the various levels of an integrated circuit. SEM voltage contrast characterization inspection is performed after various process steps are performed.

Figure 12A:
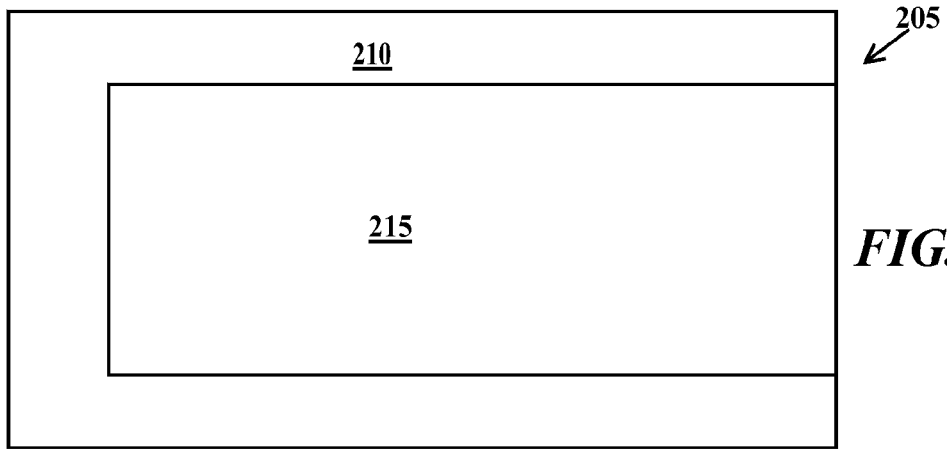
FIGS. 12A through 12C are top views of the same region of a level of an integrated circuit design illustrating the sequence of adding a voltage contrast characterization structures and fill shapes to an integrated circuit according to an embodiment of the present invention.
Figure 12B:
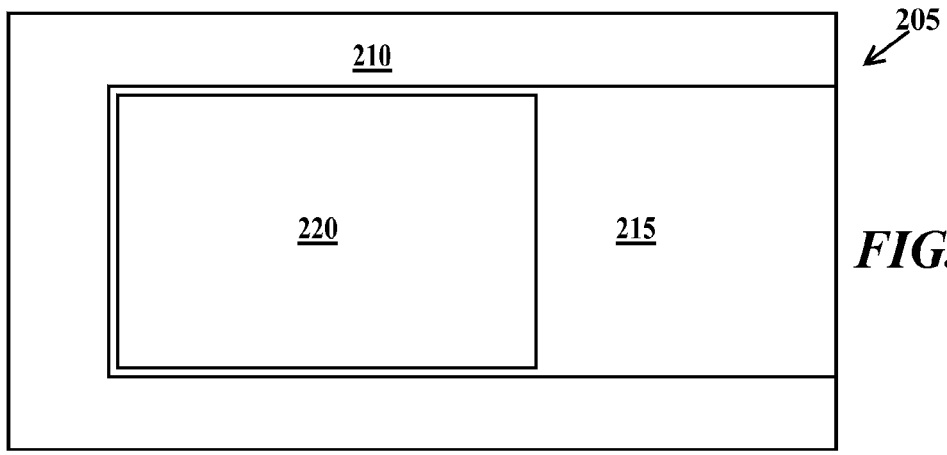
Figure 12C:
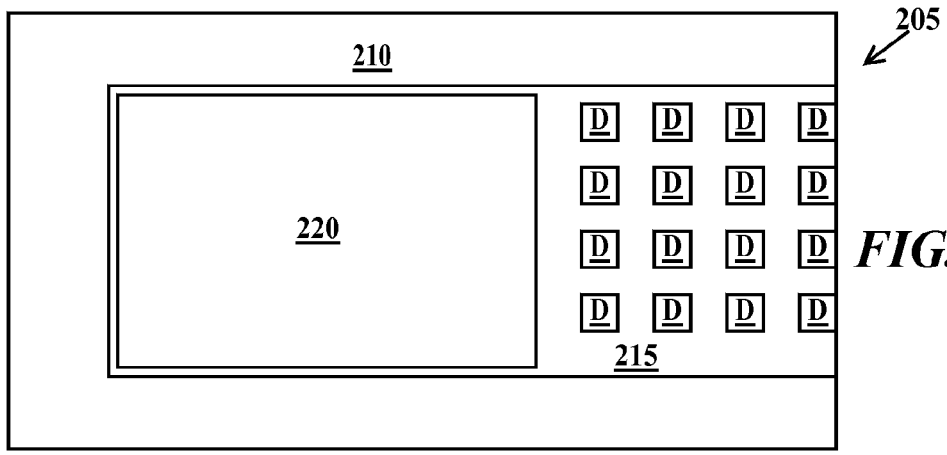

FIGS. 12A through 12C are top views of the same region of a level of an integrated circuit design illustrating the sequence of adding a voltage contrast characterization structure and fill shapes to an integrated circuit according to an embodiment of the present invention. In FIG. 12A, a region 205 of an integrated circuit design includes a functional circuit region 210 and an open region 215. In FIG. 12B, a voltage contrast characterization cell 220 has been added to open region 215. In FIG. 12C, design fill shapes "D" have been added to open region 215. Voltage contrast characterization cells of FIGS. 12A, 12B, and 1CA are examples of voltage contrast characterization cell 220.

Figure 13A:
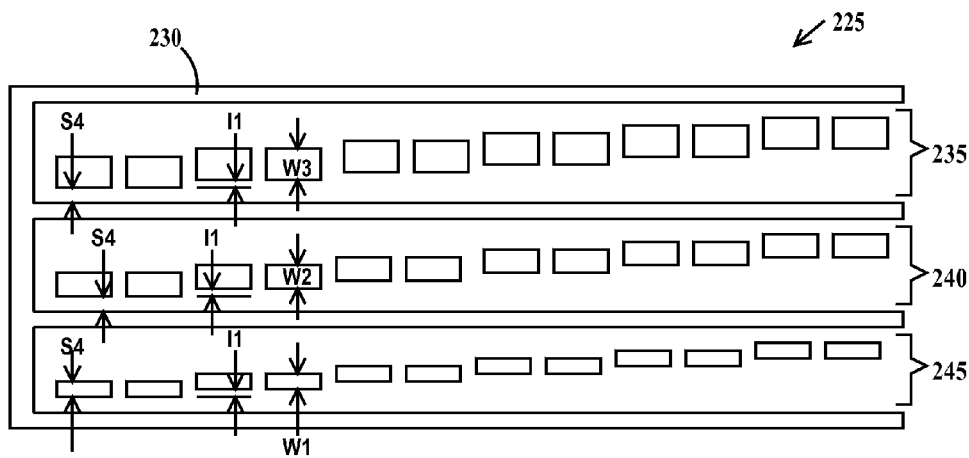
FIG. 13A is a top view of a first exemplary voltage contrast characterization monitor according to an embodiment of the present invention and FIG. 13B is an exemplary top view of the structure of FIG. 13A simulating defect detection according to an embodiment of the present invention.
Figure 13B:
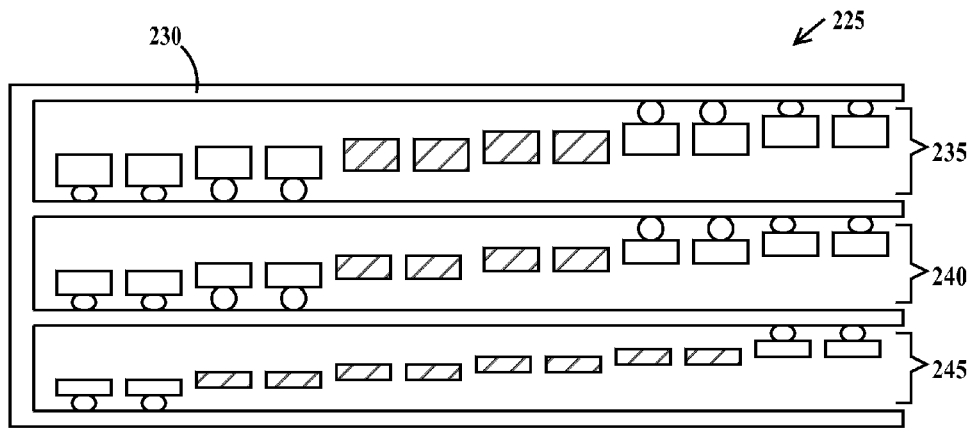

FIG. 13A is a top view of a first exemplary voltage contrast characterization monitor according to an embodiment of the present invention and FIG. 13B is an exemplary top view of the structure of FIG. 13A simulating defect detection according to an embodiment of the present invention. In FIG. 13A a voltage contrast characterization cell 225 includes a ground structure 230 (virtual or physical) comprising an exemplary series of four (there may be more or less than four) interconnected electrically conductive wire fingers. Interspersed between respective adjacent wire finger pairs are groups of physically and electrically isolated electrically conductive blocks 235, 240 and 245.

Blocks of group 235 have width W3. A first pair of blocks of group 235 are spaced a distance S4 from the nearest wire finger. Subsequent pairs of blocks of group 235 are incremented a distance I1 from the nearest wire finger. For example, a first pair of blocks of group 235 is spaced S4 from the nearest wire finger, a second pair of blocks of group 235 is spaced a distance S4+I1 from the nearest wire finger, and third pair of blocks of group 235 is spaced a distance S4=I1+I1 from the nearest wire finger. Blocks 240 have a width W2 which is less than W3. A first pair of blocks of group 240 are spaced a distance S4 from the nearest wire finger. Subsequent pairs of blocks of group 240 are incremented a distance I1 from the nearest wire finger. For example, a first pair of blocks of group 240 is spaced S4 from the nearest wire finger, a second pair of blocks of group 240 is spaced a distance S4+I1 from the nearest wire finger, and third pair of blocks of group 240 is spaced a distance S4=I1+I1 from the nearest wire finger. Blocks 245 have a width W1 which is less than W2. A first pair of blocks of group 245 are spaced a distance S4 from the nearest wire finger. Subsequent pairs of blocks of group 245 are incremented a distance I1 from the nearest wire finger. For example, a first pair of blocks of group 245 is spaced S4 from the nearest wire finger, a second pair of blocks of group 245 is spaced a distance S4+I1 from the nearest wire finger, and third pair of blocks of group 245 is spaced a distance S4=I1+I1 from the nearest wire finger.

In one example, ground structure 230 and blocks 235, 240 and 245 are metal (e.g., copper) wires of interconnect layers of an integrated circuit. Voltage contrast characterization cell 225 is a process variation monitor for shorts. Keeping in mind FIG. 10C, in one example, voltage characterization cell 225 is positioned in place of voltage contrast cell 220 of FIG. 10C. The width W2 is selected to be the same as the widths of wires of circuits of functional circuit region 210 that are adjacent to open/fill region 215. The spacing S4+I1 is selected to be the same as spacing between adjacent wires of functional circuit region 210 that are adjacent to open/fill region 215. Thus a range of wire widths and spaces less than, equal to and greater than wire spacing and wire widths circuits of functional circuit region 210 that are adjacent to open/fill region 215.

In FIG. 13B, cross-hatched blocks of groups 235, 240 and 245 appear bright if they are shorted to ground structure 230 and blocks of groups 235, 240 and 245 appear dark or less bright if they are not shorted to ground structure 230.

Figure 14A:
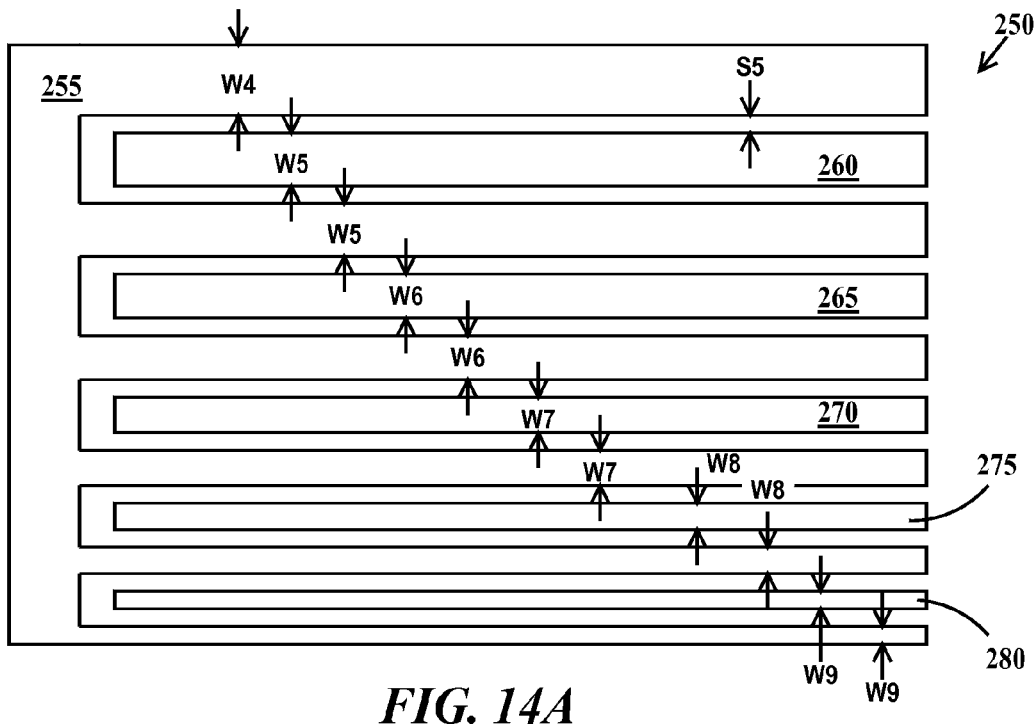
FIG. 14A is a top view of a second exemplary voltage contrast characterization monitor according to an embodiment of the present invention and FIG. 14B is an exemplary top view of the structure of FIG. 14A simulating defect detection according to an embodiment of the present invention.
Figure 14B:
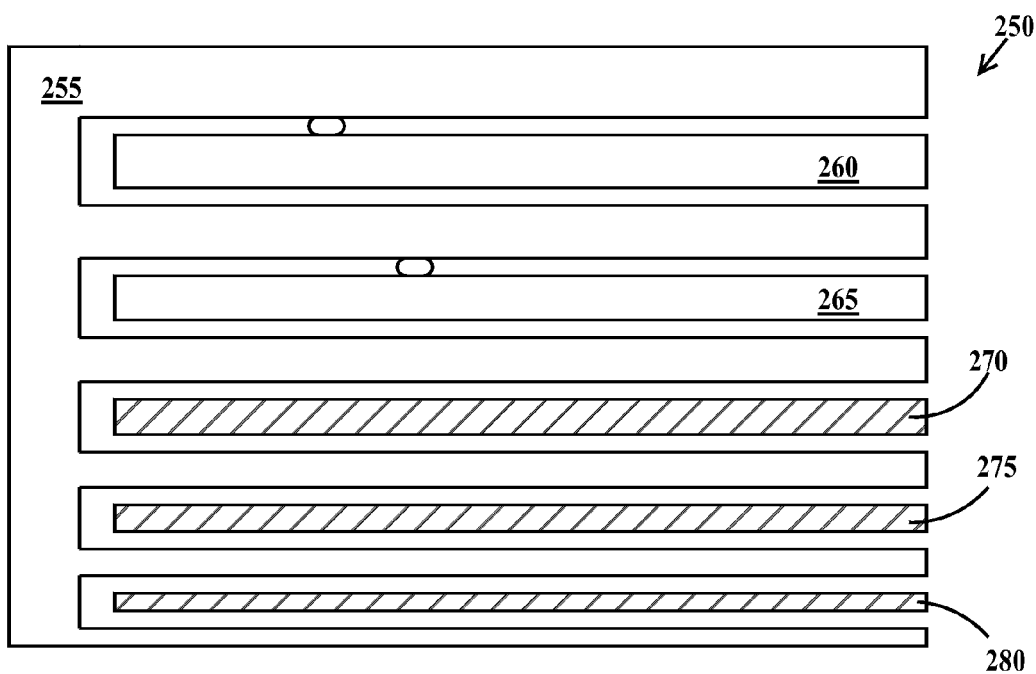

FIG. 14A is a top view of a second exemplary voltage contrast characterization monitor according to an embodiment of the present invention and FIG. 14B is an exemplary top view of the structure of FIG. 14A simulating defect detection according to an embodiment of the present invention. In FIG. 14A a voltage contrast characterization cell 250 includes a ground structure 255 (virtual or physical) comprising an exemplary series of six (there may be more or less than six) interconnected electrically conductive wire fingers of decreasing width. Interspersed between respective adjacent wire finger pairs are five physically and electrically isolated electrically conductive wires 260, 265, 270, 275 and 280. All wires are spaced a distance S5 from adjacent wire fingers.

The first wire finger of ground structure 255 has a width W4, the second wire finger a width of W5, the third wire finger a width of W6, the fourth wire finger a width of W7 and the fifth wire finger a width of W8 and the sixth wire finger has a width of W9 where W4 is greater than W5 is greater than W6 is greater than W7 is greater than W8 is greater than W9. Wire 260 has a width W5 and is positioned between the first and second wire fingers. Wire 265 has a width W6 and is positioned between the second and third wire fingers. Wire 270 has a width W7 and is positioned between the third and fourth wire fingers. Wire 275 has a width W8 and is positioned between the fourth and fifth wire fingers. Wire 280 has a width W9 and is positioned between the fifth and sixth wire fingers.

In one example, ground structure 255 and wires 260, 265, 270, 275 and 280 are metal (e.g., copper) wires of interconnect layers of an integrated circuit. Voltage contrast characterization cell 250 is a process variation monitor for shorts. Keeping in mind FIG. 10C, in one example, voltage characterization cell 250 is positioned in place of voltage contrast cell 220 of FIG. 10C. The widths W5, W6, W7, W8 and W9 are selected to include the width of wires in circuit region 210 with some being larger and some being smaller (through not less than the minimum wire width of the wiring level of FIG. 10C). Thus voltage contrast characterization cell 250 includes a range of wire widths less than, equal to and greater than and wire widths circuits of functional circuit region 210 that are adjacent to open/fill region 215.

In FIG. 14B, cross-hatched wires 270, 275 and 280 appear bright if they are shorted to ground structure 255 and wires 260 and 265 appear dark or less bright if they not are shorted to ground structure 255.

Figure 15A:
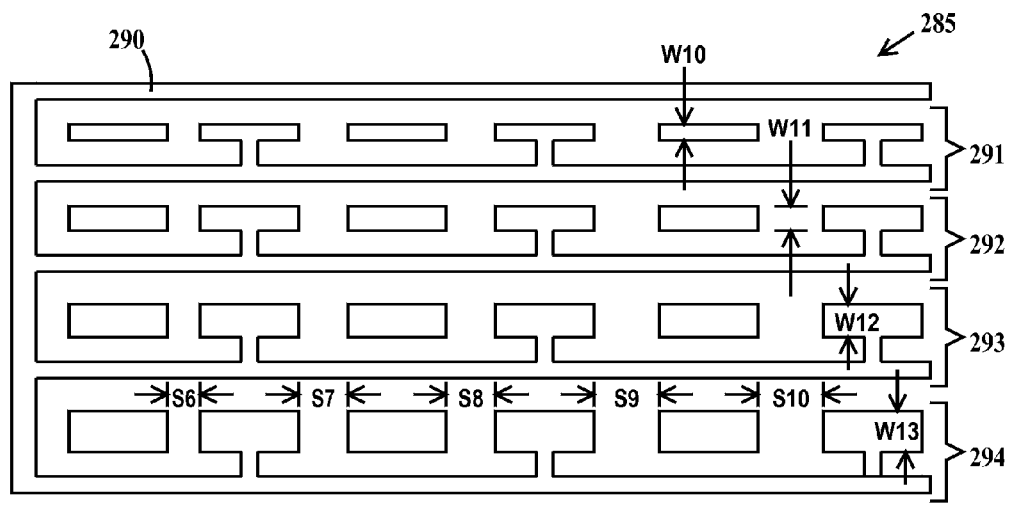
FIG. 15A is a top view of a third exemplary voltage contrast characterization monitor according to an embodiment of the present invention and FIG. 15B is an exemplary top view of the structure of FIG. 15A simulating defect detection according to an embodiment of the present invention.
Figure 15B:
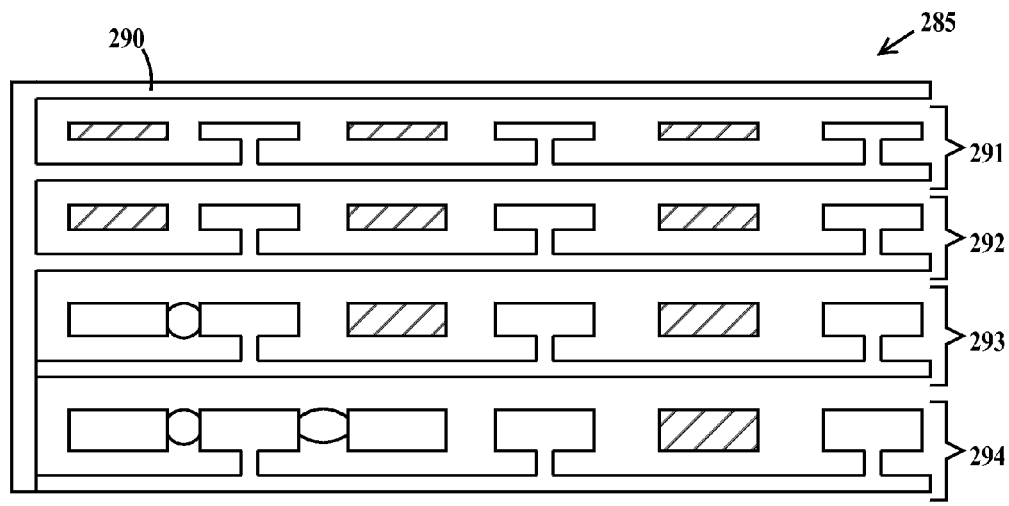

FIG. 15A is a top view of a third exemplary voltage contrast characterization monitor according to an embodiment of the present invention and FIG. 15B is an exemplary top view of the structure of FIG. 15A simulating defect detection according to an embodiment of the present invention. In FIG. 15A a voltage contrast characterization cell 285 includes a ground structure 290 (virtual or physical) comprising an exemplary series of five (there may be more or less than five) interconnected electrically conductive wire fingers. Interspersed between respective adjacent wire finger pairs are exemplary groups of six (there may be more or less than six) electrically conductive blocks 291, 292, 293 and 294. First, third and fifth blocks of groups of blocks 291, 292, 293 and 294 are physically and electrically isolated second, fourth and sixth blocks of groups of blocks 291, 292, 293 and 294 are physically and electrically connected to an immediately adjacent wire finger.

Blocks of group 291 have width W10. Respective ends of the first and second blocks of group of blocks 291 (an isolated block and a connected to a finger block) are spaced a distance S6 apart. Respective ends of the second and third blocks of group of blocks 291 (a connected to a finger block and an isolated block) are spaced a distance S7 apart. Respective ends of the third and fourth blocks of group of blocks 291 (an isolated block and a connected to a finger block) are spaced a distance S8 apart. Respective ends of the fourth and fifth blocks of group of blocks 291 (a connected to a finger block and an isolated block) are spaced a distance S9 apart. Respective ends of the fifth and sixth blocks of group of blocks 291 (an isolated block and a connected to a finger block) are spaced a distance S10 apart.

Blocks of group 292 have width W11. Respective ends of the first and second blocks of group of blocks 292 (an isolated block and a connected to a finger block) are spaced a distance S6 apart. Respective ends of the second and third blocks of group of blocks 292 (a connected to a finger block and an isolated block) are spaced a distance S7 apart. Respective ends of the third and fourth blocks of group of blocks 292 (an isolated block and a connected to a finger block) are spaced a distance S8 apart. Respective ends of the fourth and fifth blocks of group of blocks 292 (a connected to a finger block and an isolated block) are spaced a distance S9 apart. Respective ends of the fifth and sixth blocks of group of blocks 292 (an isolated block and a connected to a finger block) are spaced a distance S10 apart.

Blocks of group 293 have width W12. Respective ends of the first and second blocks of group of blocks 293 (an isolated block and a connected to a finger block) are spaced a distance S6 apart. Respective ends of the second and third blocks of group of blocks 293 (a connected to a finger block and an isolated block) are spaced a distance S7 apart. Respective ends of the third and fourth blocks of group of blocks 293 (an isolated block and a connected to a finger block) are spaced a distance S8 apart. Respective ends of the fourth and fifth blocks of group of blocks 293 (a connected to a finger block and an isolated block) are spaced a distance S9 apart. Respective ends of the fifth and sixth blocks of group of blocks 293 (an isolated block and a connected to a finger block) are spaced a distance S10 apart.

Blocks of group 294 have width W11. Respective ends of the first and second blocks of group of blocks 294 (an isolated block and a connected to a finger block) are spaced a distance S6 apart. Respective ends of the second and third blocks of group of blocks 294 (a connected to a finger block and an isolated block) are spaced a distance S7 apart. Respective ends of the third and fourth blocks of group of blocks 294 (an isolated block and a connected to a finger block) are spaced a distance S8 apart. Respective ends of the fourth and fifth blocks of group of blocks 294 (a connected to a finger block and an isolated block) are spaced a distance S9 apart. Respective ends of the fifth and sixth blocks of group of blocks 294 (an isolated block and a connected to a finger block) are spaced a distance S10 apart. W10 is less than W11 which is less than W12 which is less than W13. S6 is less than S7 which is less than S8 which is less than S9 which is less than S10 which is less than S11.

In one example, ground structure 290 and blocks of groups of blocks 291, 292, 293 and 294 are metal (e.g., copper) wires of interconnect layers of an integrated circuit. Voltage contrast characterization cell 285 is a process variation monitor for wire tip to wire tip shorts. Keeping in mind FIG. 12C, in one example, voltage characterization cell 285 is positioned in place of voltage contrast cell 220 of FIG. 12C. The widths W10, W11, W12 and W13 are selected to include the width of wires in circuit region 210 with some being larger and some being smaller (through not less than the minimum wire width of the wiring level of FIG. 12C). The spaces S6, S7, S8, S9, S10 and S11 are selected to include the space between wire ends of wires in circuit region 210 with some being larger and some being smaller (through not less than the minimum wire to wire space of the wiring level of FIG. 12C). Thus voltage contrast characterization cell 280 includes a range of wire widths less than, equal to and greater than and wire widths circuits of functional circuit region 210 that are adjacent to open/fill region 215 as well as a range of wire to wire spaces less than, equal to and greater than and wire to wire space of circuits of functional circuit region 210 that are adjacent to open/fill region 215.

In FIG. 15B, cross-hatched blocks of groups 291, 292 and 293 appear bright if they are shorted to ground structure 290 and blocks of groups 293 and 294 appear dark or less bright if they are not shorted to ground structure 290.

Figure 16:
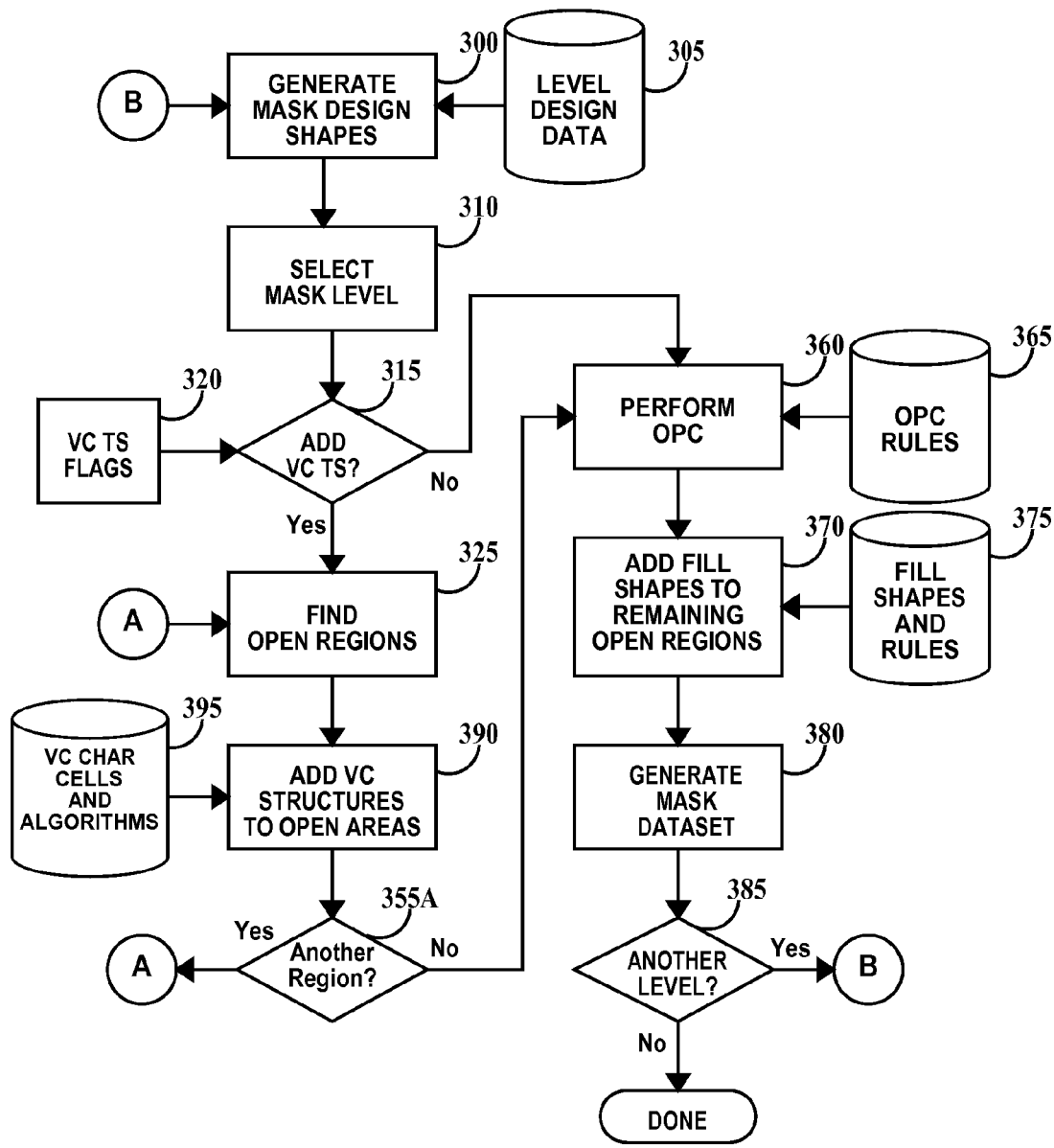
FIG. 16 is a flowchart of a method of adding voltage contrast characterization structures into an integrated circuit design according to an embodiment of the present invention.

FIG. 16 is a flowchart of a method of adding voltage contrast characterization structures into an integrated circuit design according to an embodiment of the present invention. FIG. 16 is similar to FIG. 11 except steps 330, 335, 340, 345 and 355 and file 350 of FIG. 9 are replaced with steps 355A and 390 and file 395 in FIG. 16. After finding open regions in step 325, in step 390, voltage contrast characterization cells are placed in the open areas adjacent. The voltage contrast characterization cells are selected from voltage contrast characterization cell and algorithms file 395 which contains pre-designed voltage contrast characterization cells and rules and algorithms for modifying the pre-designed voltage contrast characterization cells based on the circuits in regions adjacent to the open regions. The voltage contrast characterization cells are replacing fill shapes, so it is preferred that the pattern density of the voltage contrast characterization cells replicate the local functional circuit pattern density. Next, in step 355A it is determined if another open region is to have a voltage contrast characterization cell placed, if yes the method proceeds to step 335 otherwise the method proceeds to step 360.

Figure 17:
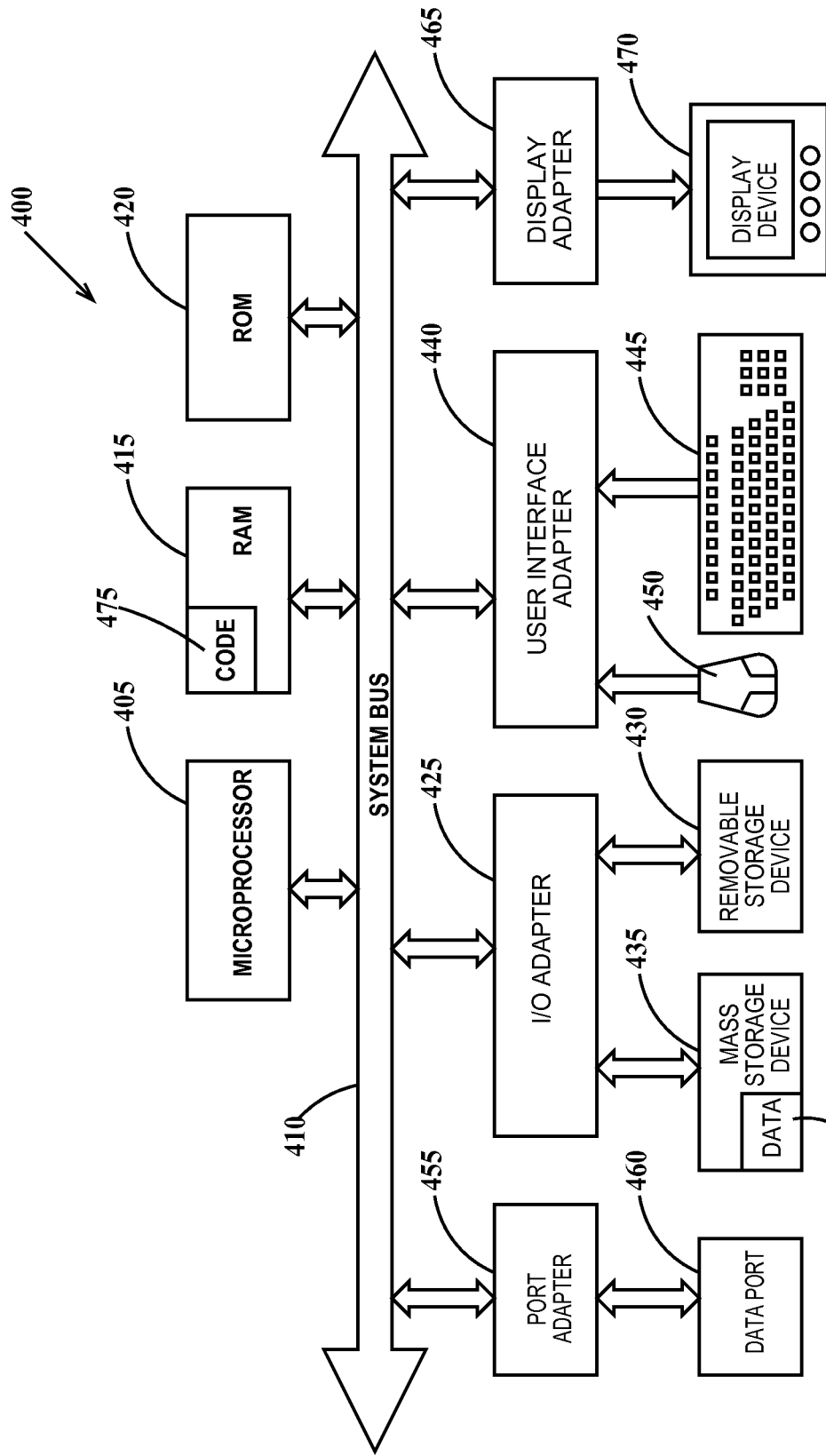
FIG. 17 is a schematic block diagram of a general-purpose computer for practicing the embodiments of the present invention.

FIG. 17 is a schematic block diagram of a general-purpose computer for practicing the embodiments of the present invention particularly the methods described by FIGS. 9 and 14. In FIG. 15, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for connecting a removable data and/or program storage device 330 and a mass data and/or program storage device 435, a user interface adapter 440 for connecting a keyboard 445 and a mouse 450, a port adapter 455 for connecting a data port 460 and a display adapter 465 for connecting a display device 470. RAM 435 includes code 475 for storing application software and other software and mass storage device 435 includes document and file storage data 480 which includes documents and databases created by the user or software applications.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for the computer program created to run the present invention is loaded on the appropriate removable data and/or program storage device 430, fed through data port 460 or typed in using keyboard 445.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts of FIGS. 11 and 16 and block diagrams of FIG. 17 illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Thus the embodiments of the present invention provide SEM passive voltage contrast characterization structures, methods and design systems for within chip defect and process variation characterization.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   (a) selecting a design level of a mask design shapes file stored on a non-transitory memory unit of a computer;
   (b) after (a) selecting a region of said design level having an open region having no fill shapes or design shapes and an adjacent circuit region having circuit design shapes;
   (c) after (b) selecting a sub-region of said circuit region adjacent to said open region;
   (d) after (c) using said computer, copying circuit design shapes of said sub-region to generate a characterization cell identical to the circuit design shapes of said sub-region;
   (e) after (d) modifying said characterization cell to generate a passive voltage contrast characterization cell; and
   (f) before placing fill shapes and after (e) placing said passive voltage contrast characterization cell into said open region adjacent to said sub-region to generate a modified design level and storing said modified design level on said memory unit of said computer.

2. The method of claim 1, further including:
   after said placing said characterization cell into said open region performing optical proximity corrections to design shapes of both said circuit region and design shapes of said passive voltage contrast characterization cell.

3. The method of claim 2, further including:
   after said performing optical proximity corrections, adding design fill shapes to regions of said open region not containing a passive voltage contrast characterization cell; and
   after said adding design fill shapes, generating a mask dataset.

4. The method of claim 1, wherein said modifying said characterization cell comprises cropping the perimeter of said characterization cell.

5. The method of claim 4, wherein said modifying said characterization cell includes adding or removing design shapes to create a ground shape and shapes not connected to said ground shape.

6. The method of claim 1, further including:
   generating two or more identical copies of said passive voltage contrast characterization cell;
   modifying each of said two or more copies of said passive voltage contrast characterization cell to include a feature that is larger or smaller than a same feature of said passive voltage contrast characterization cell to generate two or more modified passive voltage contrast characterization cells; and
   placing said two or more modified passive voltage contrast characterization cell into said open region.

7. The method of claim 1, further including:
   selecting one or more additional design levels of said mask design shapes file;
   selecting additional sub-regions of said one or more additional design levels corresponding to said sub-region of said design level;

copying design shapes of said additional sub-regions of said one or more design levels to one or more additional characterization cells;

modifying said one or more characterization cells to generate one or more additional passive voltage contrast characterization cells; and placing said one or more additional passive voltage contrast characterization cells into additional open regions of one or more additional design levels that are adjacent to said additional sub-regions of one or more additional design levels; said passive voltage contrast characterization cell and said one or more additional passive voltage contrast characterization cells forming a single multi-layer passive voltage contrast characterization cell design.

8. An integrated circuit chip, comprising:
a first region having only circuit features;
a second region having only a passive voltage contrast characterization cell, said passive voltage contrast characterization cell having first features duplicating the size and relative positions of circuit features of a sub-region of said first region and having second features interconnected to form a ground feature;
a third region having only fill shapes; said fill shapes not connected to each other or to any shape of said first or second regions; and
wherein said first and second features of said second region are not connected to said circuit features of said first region or to said fill shapes of said third region.

9. The integrated circuit of claim 8, wherein said ground feature of said passive voltage contrast characterization cell is a virtual ground not connected to any portion of said circuit features of said first region.

10. The integrated circuit of claim 8, wherein said passive voltage characterization cell is positioned adjacent to said sub-region.

11. The integrated circuit of claim 8, wherein(i) said circuit features and (ii) said first features and said second features of said passive voltage contrast cell, (iii) and said fill shapes comprise electrically conductive metal damascene wires.

12. A method comprising:
providing an integrated circuit chip comprising:
a first region having circuit features;
a second region having a passive voltage contrast characterization cell, said passive voltage contrast having first features duplicating the size and relative positions of circuit features of a sub-region of said first region and having second features interconnected to form a ground feature;
a third region having fill shapes; said fill shapes not connected to each other or to any shape of said first or second regions; and
wherein said first and second features of said second region are not connected to said circuit features of said first region or to said fill shapes of said third region;
placing said integrated circuit chip in a scanning electron microscope (SEM); and
using said SEM, performing an inspection of said passive voltage contrast characterization cell under voltage contrast conditions.

13. The method of claim 12, wherein said ground feature of said passive voltage contrast characterization cell is a virtual ground not connected to any portion of said circuit features of said first region.

14. The method of claim 12, wherein said ground feature is electrically connected to a ground of said integrated circuit.

15. The method of claim 12, wherein said passive voltage contrast characterization cell is positioned adjacent to said sub-region.

16. The method of claim 12, wherein (i) said circuit features and (ii) said first features and said second features of said passive voltage contrast cell, (iii) and said fill shapes comprise electrically conductive metal damascene wires.

17. The method of claim 12, wherein said passive voltage contrast characterization cell comprises electrically conductive vias connecting electrically conductive metal damascene wires in a first wiring level to electrically conductive metal damascene wires in second adjacent wiring level.

18. The method of claim 12, wherein said integrated circuit chip is partially fabricated and said inspection is performed while said integrated circuit chip is integral to a semiconductor wafer containing a multiplicity of individual integrated circuit chips.

19. The method of claim 12, wherein said integrated circuit chip is partially fabricated and said inspection is performed after a chemical-mechanical-polish process step and while said integrated circuit chip is integral to a semiconductor wafer containing a multiplicity of individual integrated circuit chips.

20. A computer system comprising a processor, a memory coupled to the processor, and a computer readable storage device coupled to the processor, said storage device containing program code configured to be executed by the processor via the memory to implement a method for designing a voltage contrast characterization cell, said method comprising:
(a) selecting a design level of a mask design shapes file stored on a non-transitory memory unit of the computer;
(b) after (a) selecting a region of said design level having an open region having no fill shapes or design shapes and an adjacent circuit region having circuit design shapes;
(c) after (b) selecting a sub-region of said circuit region adjacent to said open region;
(d) after (c) using the computer, copying circuit design shapes of said sub-region to generate a characterization cell identical to the circuit design shapes of said sub-region;
(e) after (d) modifying said characterization cell to generate a passive voltage contrast characterization cell; and
(f) before placing fill shapes and after (e) placing said passive voltage contrast characterization cell into said open region adjacent to said sub-region to generate a modified design level and storing said modified design level on the memory unit of the computer.

21. The computer system of claim 20, the method further including the step of:
after said placing said characterization cell into said open region performing optical proximity corrections to design shapes of both said circuit region and design shapes of said passive voltage contrast characterization cell.

22. The computer system of claim 21, the method further including the step of:
after said performing optical proximity corrections, adding design fill shapes to regions of said open region not containing a passive voltage contrast characterization cell.

23. The computer system of claim 22, the method further including:
   after said adding design fill shapes, generating a mask dataset.

24. The computer system of claim 20, wherein said method step of modifying said characterization cell comprises cropping the perimeter of said characterization cell.

25. The computer system of claim 20, wherein said method step of modifying said characterization cell includes adding or removing design shapes to create a ground shape and shapes not connected to said ground shape.

* * * * *